United States Patent [19]

Harvey et al.

[11] Patent Number: 5,126,660
[45] Date of Patent: Jun. 30, 1992

[54] OPTICAL PROBING METHOD AND APPARATUS

[75] Inventors: George T. Harvey, Princeton; Michael S. Heutmaker, Trenton, both of N.J.; Mark G. Kuzyk, Pullman, Wash.; Kenneth D. Singer, Pepper Pike, Ohio

[73] Assignee: AT&T Bell Laboratories, Murray Hill, N.J.

[21] Appl. No.: 636,782

[22] Filed: Jan. 2, 1991

[51] Int. Cl.$^5$ .......................... G01R 31/28; G02F 1/01
[52] U.S. Cl. .................. 324/158 R; 324/96; 359/265; 359/273
[58] Field of Search ............ 324/158 R, 96; 350/357, 350/486; 359/265, 273

[56] References Cited

U.S. PATENT DOCUMENTS

| | | | |
|---|---|---|---|
| 4,105,915 | 8/1978 | Clay et al. | 350/486 |
| 4,618,449 | 7/1987 | Bloom et al. | 356/364 |
| 4,864,222 | 9/1989 | Aoshima et al. | 324/158 R |
| 4,875,006 | 10/1989 | Henley et al. | 324/158 R |
| 4,938,571 | 7/1990 | Cogan et al. | 350/357 |

OTHER PUBLICATIONS

"100 GHz On-Wafer S-parameter Measurements by Electrooptic Sampling," R. Majidi-Ahy et al., 1989 *IEEE MIT-S Digest*, pp. 229-301.

"Fiber Coupling Fabrication with Automatic Fusion-Elongation Processes for Low Excess Loss and High Coupling-Ratio Accuracy," Y. Yokahama et al., *Journal of Lightwave Technology*, vol. LT-5, No. 7, Jul. 1987, pp. 910-915.

"Thin Film Processing of Polymers for Nonlinear Optics," R. D. Small et al., *SPIE*, vol. 682, 1986, pp. 160-168.

"Electrochromism for Organic Materials in Polymer All-Solid State Systems," Y. Hirai et al., Applied Physics Letters, vol. 43, No. 7, Oct. 1983, pp. 704-705.

*Primary Examiner*—Ernest F. Karlsen
*Attorney, Agent, or Firm*—R. B. Anderson

[57] ABSTRACT

An integrated circuit device (11) is tested by directing a laser beam (19) onto an electrochromic member (17) in close proximity to a conductor (13) of the integrated circuit. Reflected laser light is directed to a detector (21) which converts it to an electrical signal for display by a lock-in amplifier (25). The display characterizes the voltage on the conductor (17) and thereby permits diagnosis of the operation of the integrated circuit (11).

2 Claims, 1 Drawing Sheet

OPTICAL PROBING METHOD AND APPARATUS

TECHNICAL FIELD

This invention relates to techniques for diagnosing and testing integrated circuits and, more particularly, to non-invasive testing techniques using a laser beam.

BACKGROUND OF THE INVENTION

A common method for testing semiconductor integrated circuit chips is to contact a conductor on the chip with a conductive probe so that the voltage on the conductor can be measured. The probe itself, however, inevitably affects the circuit since it constitutes an electrical load on it. As microelectronic circuit densities increase, the deleterious effects of electrical loading also increase; also, it becomes more difficult to make a reliable contact to the conductor with the probe.

The Bloom et al., U.S. Pat. No. 4,681,449, granted Jul. 21, 1987, and the paper, "One Hundred GHz On-Wafer S-Parameter Measurements by Electrooptic Sampling," by R. Majidi-Ahy et al., 1989 *IEEE MTT-S Digest*, pp. 229-301, are examples of the literature describing the use of optical probing for making integrated circuit tests. Optical probing relies on the proximity to the conductor under test of a member which displays the Pockel's effect; electric fields extending into such a material are capable of modulating the polarization of a laser beam propagating through it. By directing a polarized laser beam through the Pockel's effect member and analyzing the polarization modulations of the exiting laser beam, one can characterize the voltage on the conductor and thereby test, or diagnose, the operation of the semiconductor chip. This technique is sometimes described as "non-invasive" since it avoids both loading and the possibility of damage due to physical contact; it is particularly applicable to group III-V semiconductor chips such as gallium arsenide, which inherently display the Pockel's effect. The laser probe beam is typically directed through the gallium arsenide and reflected back upon itself by a metal conductor, although, alternatively, the laser beam could be directed through the Pockel's effect material without being reflected.

Because the Pockel's effect medium modulates the polarization of the laser beam, the beam must initially be polarized. After it has been modulated, the polarization modulations of the beam must typically be converted to intensity modulations, which can then be converted by a photodetector to electrical signal modulations. The polarized light cannot be transmitted by an optical fiber because the fiber affects its polarization in ways that vary with time, temperature and stress due to bending; consequently, the laser beam is transmitted to the electronic device through free space. It would be desirable to reduce the complexity of laser beam probe apparatus, and considerable work to that end has been done and is being done in the industry; it would also be desirable to use an optical fiber for laser beam transmission.

SUMMARY OF THE INVENTION

We have found that many benefits can be obtained by using an electrochromic member, rather than Pockel's effect member, in close proximity to a conductor being tested by laser probing. An electrochromic material is one having an optical absorption coefficient that changes in response to an applied electric field. We have found that electric fields from the conductor extending through an electrochromic material can be used to intensity modulate a laser beam directed through the material. It is not necessary to polarize the laser beam prior to probing, and the intensity modulated laser beam exiting the electrochromic material can be transmitted directly to the photodetector.

Advantageously, an electrochromic medium can be made by dispersing an optically non-linear dye in a polymer. A polymer containing the optically non-linear dye in solution can be spun onto the surface of a semiconductor wafer in the same manner that other fluids are distributed on wafer surfaces. When the solvent evaporates, the dye-containing polymer is bonded to conductors on the surface of the wafer and can be used effectively to modulate a laser beam reflected from the coated conductor. This may be particularly applicable to testing silicon circuits, which are not as amenable to prior art laser probing as are III-V semiconductors since silicon does not display the Pockel's effect.

In another embodiment, the electrochromic polymer is placed on the tip of an optical fiber. The fiber is then contacted to a conductor of the device under test. Laser light is transmitted through the optical fiber, is reflected back into the optical fiber by the conductor of the device, and the reflected laser light is removed from the optical fiber for conversion to an electrical signal. Unlike a conductive probe, the optical fiber does not electrically load the circuit. The fact that the polarization of the light cannot be preserved by an optical fiber is of no consequence, since there is no need with the invention for polarized light.

These and other objects, features and benefits of the invention will be better understood from a consideration of the following detailed description taken in conjunction with the accompanying drawing.

DETAILED DESCRIPTION

Figure 1:
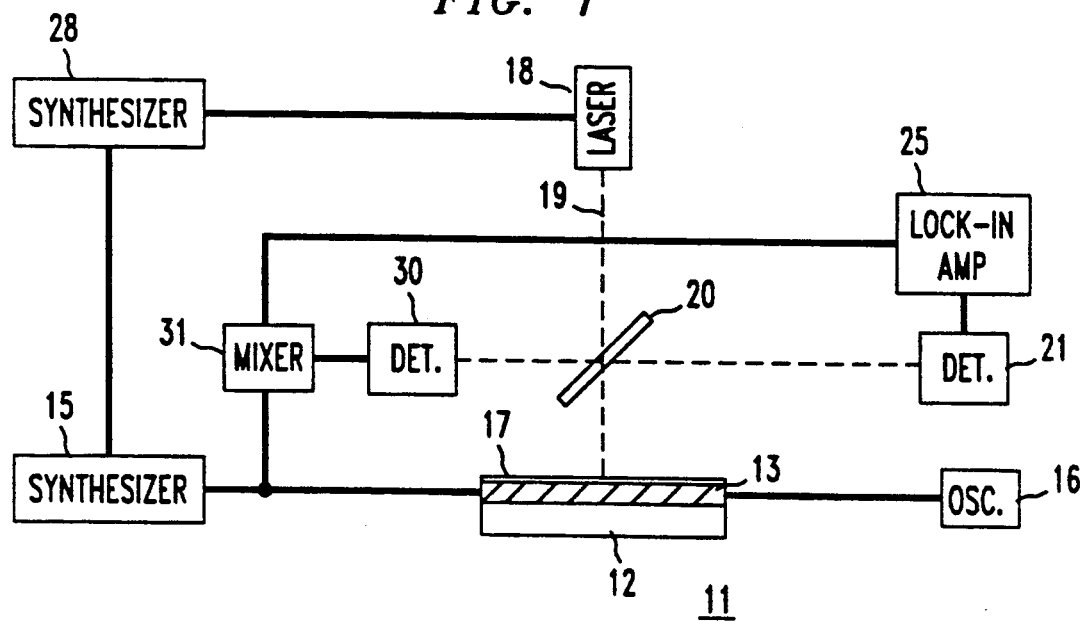
FIG. 1 is a functional block diagram of optical probing apparatus for testing an integrated circuit chip in accordance with an illustrative embodiment of the invention.

Referring now to FIG. 1, there is shown a functional block diagram of a circuit for testing high-speed or high-frequency integrated circuits using optical probing for non-invasive characterization of a test signal in an integrated circuit device 11. The integrated circuit device 11 illustratively comprises a body 12 of semiconductor material such as silicon and a conductor 13 for transmitting the test signal. The test signal is generated illustratively by a microwave synthesizer 15, which produces a high frequency test signal that is transmitted by the conductor 13 to an oscilloscope 16. It is known in the art that optical probing is useful primarily for testing integrated circuits operating at frequencies above about fifty megahertz and having conductors with widths less than about 0.1 millimeters.

In accordance with the invention, the conductor 12 is overlaid with a layer 17 of electrochromic material, that is, a material having an optical absorption coefficient that changes as a function of applied electric field. The propagating test signal is sampled by using a laser 18 to produce a laser beam 19, which is directed through a beam splitter 20 toward the integrated circuit device. The electric field accompanying the test signal propagating on conductor 13 modulates the optical absorption characteristic of electrochromic layer 17. The laser light is reflected back upon itself by conductor 13, and, as it propagates through the electrochromic layer in both directions, it is intensity modulated as a function of the test signal.

The reflected light is projected by the beam splitter 20 to a detector 21, which may be a photodetector which has a sufficiently high frequency response to convert the modulations of the incoming light to electrical intensity modulations. The electrical modulations are directed to a lock-in amplifier 25, which displays the amplitude and phase of the electrical signal. This display constitutes a useful characterization of the integrated circuit device 11 under test from which a worker may determine whether it is operating properly.

The laser 18 is preferably a pulsed laser which is excited by a microwave frequency generated by a microwave synthesizer 28. The synthesizer 28 drives the laser to emit light as a train of short pulses. The frequency of these pulses is preferably related to the frequency of the test signal; this can be implemented by an interconnection of synthesizers 15 and 28, as shown. Additionally, it is preferred that a portion of laser beam 19 be projected by the beam splitter 20 to a detector 30 for ultimate use as a phase reference. The output of the detector 30 and part of the output of synthesizer 15 are directed to a mixer 31, which generates a frequency equal to the difference of the pulse frequency of the laser beam 19 and the test signal directed through the electronic device 11. This difference frequency is then directed to lock-in amplifier 25 where it is used as a phase reference for aiding in interpreting the signal directed to the lock-in amplifier from detector 21.

As with the prior art optical probing techniques described above, the apparatus of FIG. 1 has as its intended purpose the optical probing of semiconductor integrated circuits under circumstances which make conductive probing disadvantageous. At frequencies above fifty megahertz, the loading of such probes becomes large. Where the width of the conductors is less than 0.1 millimeters, reliable physical contact becomes difficult and the danger of physical damage increases. For these reasons, integrated circuit device 11 of the illustrative embodiment should be assumed as being one having an operating frequency in excess of fifty megahertz and/or one upon which conductors 13 are formed having widths of less than 0.5 millimeters. The semiconductor 12 is illustratively silicon, although other semiconductors could alternatively be used.

The electrochromic layer 17 may be of any of a number of electrochromic materials such as those discussed in the paper, "Electrochromism for Organic Materials in Polymer All-Solid State Systems," by Y. Hirai et al., *Applied Physics Letters*, Vol. 43, No. 7, Oct. 1, 1983, pp. 704–705. A ten percent solution of Disperse Red 1 dye in polymethyl methacrylate (PMMA) may be spun onto a silicon wafer patterned with conductive electrodes. After spinning, a thickness of the PMMA layer on the order of a few microns after hardening would be satisfactory. Light from a doubled mode-locked Nd:YLF laser at a wavelength of 0.527 microns may be focused at the top of a five micron wide electrode conductor. The light beam may consist of a train of fifty picosecond wide pulses at a repetition rate of 99.8 megahertz. The electrode on the silicon wafer may be driven at 99.91 megahertz by the synthesizer 15. The beam splitter 20 may be a partially reflecting mirror that reflects fifty percent of the light and transmits fifty percent. The lock-in amplifier may be a Model 5301A, available from EG&G, Princeton Applied Research of Princeton, N.J. The synthesizers may be Model 8341-B synthesizers, available from the Hewlett-Packard Company of Palto Alto, Calif. Care should be taken to shield detector 21 from fields associated with the energy propagating on conductor 13. The display by the lock-in amplifier will normally be sufficient for characterizing the test signal and thereby diagnosing and testing an integrated circuit device 11.

Figure 2:
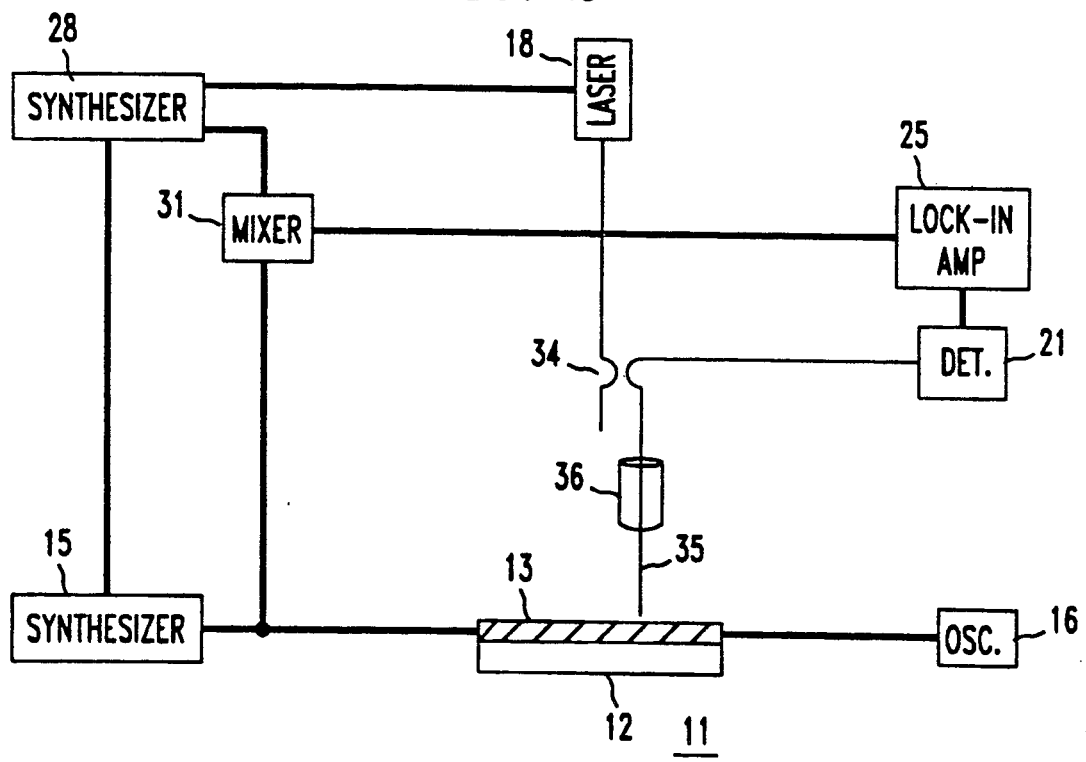
FIG. 2 is a block diagram of optical probing apparatus in accordance with another embodiment of the invention.

FIG. 2 illustrates another embodiment of the invention that works basically in the same way to produce the same results as the embodiment of FIG. 1. The components of FIG. 2 which have the same structure and function as those in the embodiment of FIG. 1 are numbered with like reference numerals. The main difference is that the output of the laser is directed to an optical fiber coupler 34, which may, for example, be of the type described in the paper, "Fiber Coupling Fabrication with Automatic Fusion-Elongation Processes for Low Excess Loss and High Coupling-Ratio Accuracy," Y. Yokahama et al., *Journal of Lightwave Technology*, Vol. LT-5, No. 7, July 1987, pp. 910–915. The output of coupler 34 is an optical fiber 35, part of which is contained within a holder 36.

Figure 3:
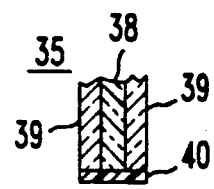
FIG. 3 is a schematic illustration of an optical fiber probe tip made in accordance with one embodiment of the invention.

Referring to FIG. 3, the optical fiber comprises a central glass core 38 surrounded by a glass cladding layer 39. In accordance with this aspect of the invention, the free end, or tip, of the optical fiber is coated with a layer 40 of electrochromic material which may be the same material as that used as layer 17 of FIG. 1. Referring again to FIG. 2, the tip of the optical fiber 35 is used as a probe for contacting the conductor 13 to be tested. Light propagated by the optical fiber 35 is transmitted through the electrochromic material 40, reflected from conductor 13 back through electrochromic 40 and thence to the optical fiber coupler 34. The intensity modulated laser light from the conductor 13 is then directed by the coupler to the detector 21 where, as before, it is converted to an electrical signal which is amplified and displayed by lock-in amplifier 25.

The advantage of the embodiment of FIG. 2 is that it does not require coating of each circuit to be tested. Rather, the optical fiber probe having the electrochromic layer 40 can be used for testing and diagnosing a number of electronic circuits 11. It should be noted that applicants' use of an electrochromic material makes possible the use of an optical fiber probe since, with the invention, there is no need to deliver polarized light to the circuit being tested; on the other hand, optical fibers are incapable of maintaining and preserving the polarization of the light required by prior art optical probing systems.

It is believed that the foregoing discussion demonstrates the reduction in complexity due to the use of the invention, which does not require polarized light for its implementation; that is, the light used may be unpolarized or it may be of arbitrary or unspecified polarization. It also permits the use of an optical fiber probe that can be used in the same manner as known conductive probes except that the probe doesn't electrically load the circuit, and the requirements for physical contact are not so severe because it need only be placed in sufficient proximity to the conductor to permit electric fields accompanying the test signal to extend through the electrochromic material. That is, there is no need for the optical probe to "dig into," and possibly damage, the conductor as is usually true of the conductive probe.

The embodiment of FIG. 2 shows the synthesizer 28 being directly connected to mixer 31 for providing the difference frequency to be used as a reference. This same kind of direct interconnection could be used in the embodiment of FIG. 1 if so desired, thus eliminating the need for the beam splitter 20 and detector 30. In either of the embodiments, the dye-containing polymer may be "poled" to increase its sensitivity to the electrical signal, i.e., to increase the modulation depth. Poling is discussed, for example, in the paper, "Thin Film Processing of Polymers for Nonlinear Optics," R. D. Small et al., *SPIE*, Vol. 682, 1986, pp. 160-168, and it involves subjecting a doped polymer film to a relatively high dc electric field at high temperature. The high temperature permits the dye molecule to rotate in response to the field, or be poled, and subsequent cooling makes the poling substantially permanent. This increases the nonlinear optical susceptibilities of optical molecular dopants in the film. Methods other than spinning, such as spraying and dipping can be used to deposit the dye-containing polymer on the integrated circuit. Various other embodiments and modifications may be made by those skilled in the art without departing from the spirit and scope of the invention.

We claim:

1. A method for diagnosing a semiconductor integrated circuit comprising the steps of:

locating an electrochromic material in proximity to a conductor of the integrated circuit;

causing a first high frequency electrical signal to be transmitted by the conductor such that electric fields of the signal extend into the electrochromic material forming and projecting a laser light beam;

directing at least part of the laser beam through at least part of the electrochromic material such that the material modulates the laser beam in accordance with the first electrical signal;

the light directed through the electrochromic material being unpolarized or of arbitrary or unspecified polarization;

the electrochromic material being coated on a first end of an optical fiber;

the first end of the optical fiber being abutted against the conductor;

the laser beam being projected into a second end of the optical fiber;

converting the modulated laser beam to a second electrical signal;

and using the second electrical signal as an aid in diagnosing the integrated circuit.

2. The method of claim 1 wherein:

the electrochromic material comprises dye contained in a polymer.

* * * * *